US 9,859,810 B2

(12) United States Patent
Yokoyama et al.

(10) Patent No.: US 9,859,810 B2
(45) Date of Patent: Jan. 2, 2018

(54) POWER CONVERTER

(71) Applicant: NISSAN MOTOR CO., LTD., Yokohama-shi, Kanagawa (JP)

(72) Inventors: Nobuaki Yokoyama, Kanagawa (JP); Kazuhiro Hayakawa, Kanagawa (JP); Takaya Ishii, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 15/037,585

(22) PCT Filed: Aug. 7, 2014

(86) PCT No.: PCT/JP2014/070881
§ 371 (c)(1),
(2) Date: May 18, 2016

(87) PCT Pub. No.: WO2015/075976
PCT Pub. Date: May 28, 2015

(65) Prior Publication Data
US 2016/0294301 A1    Oct. 6, 2016

(30) Foreign Application Priority Data
Nov. 20, 2013    (JP) .................................. 2013-239589

(51) Int. Cl.
*H02M 7/00*    (2006.01)
*H02M 7/537*    (2006.01)
(Continued)

(52) U.S. Cl.
CPC ........... *H02M 7/003* (2013.01); *H02M 7/537* (2013.01); *H05K 5/0017* (2013.01);
(Continued)

(58) Field of Classification Search
CPC .... H02M 7/003; H02M 7/537; H02M 7/5387; H02M 7/797; H02M 7/00; H02M 7/48;
(Continued)

(56) References Cited

U.S. PATENT DOCUMENTS 6,327,165 B1    12/2001    Yamane et al.
8,531,840 B2 *    9/2013    Tachibana ............. H02M 7/003
361/688

(Continued)

FOREIGN PATENT DOCUMENTS

EP    2 367 277 A2    9/2011
JP    11-069840 A    3/1999
(Continued)

*Primary Examiner* — Kyle J Moody
(74) *Attorney, Agent, or Firm* — Foley & Lardner LLP

(57) ABSTRACT

A power converter (30) comprising components of a power converter circuit, the components including switching elements (31 to 36), smoothing capacitors (37 to 39), and circuit boards (66 and 67) on which drive circuit parts for driving the switching elements are mounted, wherein the components are housed in a case (65), input power is converted and output through high-voltage terminals (69 to 79), and the high-voltage terminals (69 to 79) and the circuit boards (66 and 67) are provided in a common plane area (E).

6 Claims, 9 Drawing Sheets

(51) Int. Cl.
    *H05K 5/00*         (2006.01)
    *H05K 7/20*         (2006.01)
    *H02M 7/5387*     (2007.01)
    *H02M 7/797*      (2006.01)

(52) U.S. Cl.
    CPC ....... *H05K 7/20927* (2013.01); *H02M 7/5387* (2013.01); *H02M 7/797* (2013.01)

(58) Field of Classification Search
    CPC .... H05K 5/0017; H05K 7/20927; H05K 5/00; H05K 7/20
    USPC ................. 363/146, 147; 361/699, 688, 689
    See application file for complete search history.

(56) References Cited

U.S. PATENT DOCUMENTS

| | | | |
|---|---|---|---|
| 9,362,261 B2 * | 6/2016 | Tokuyama | .............. H01L 24/40 |
| 2009/0231811 A1 | 9/2009 | Tokuyama et al. | |
| 2011/0228479 A1 | 9/2011 | Tokuyama et al. | |
| 2012/0248909 A1 | 10/2012 | Ito et al. | |
| 2013/0194853 A1 * | 8/2013 | Tokuyama | .............. H01L 23/36 |
| | | | 363/131 |

FOREIGN PATENT DOCUMENTS

| | | |
|---|---|---|
| JP | 2006-050685 A | 2/2006 |
| JP | 2008-148530 A | 6/2008 |
| JP | 2009-219270 A | 9/2009 |
| JP | 2012-217263 A | 11/2012 |

* cited by examiner

POWER CONVERTER

TECHNICAL FIELD

The present invention relates to a power converter.

BACKGROUND ART

As a three-phase inverter (power converter) for supplying power to a three-phase circuit switched reluctance motor, there has been known the one integrated inverter components by mounting a smoothing capacitor and insulated gate bipolar transistor (IGBT) on a substrate having a water-cooling mechanism and configuring a power converter circuit by a bus bar for supplying electricity (Patent Document 1).

PRIOR ART DOCUMENT

Patent Document

[Patent Document 1] JP 1999-069840 A

SUMMARY OF INVENTION

Problems to be Solved by Invention

Incidentally, when applying this type of power converter to supply power to a drive motor for electric vehicles and to charge power from a drive motor for electric vehicles, components need to be housed in a case for their protection. Also, in order to secure insulation between a high-voltage terminal and the case, a predetermined space needs to be provided. However, in the conventional technology, because a smoothing capacitor and IGBT are configured to be mounted on a substrate and a bus bar for supplying electricity is arranged to the outermost part facing the substrate, there is a problem that the size of the case increases when a predetermined space is provided between the bus bar for supplying electricity and the case.

An object of the present invention is to provide a power converter which can suppress increase in the size of a case in order to solve the above problem.

Means for Solving Problems

With regard to a power converter comprising components of a power converter circuit including a switching element, a smoothing capacitor, and a circuit board on which drive circuit parts for driving the switching element are mounted, wherein the components are housed in a case and input power is converted and output through a high-voltage terminal, the present invention solves the above problem by arranging the high-voltage terminal and the circuit board in the common plane area.

Effect of Invention

According to the present invention, a high-voltage terminal and circuit board are both arranged in a common plane area, so that an insulating space of the high-voltage terminal and insulating space of the circuit board required are overlapped in the first direction. Accordingly, increase in the size of a case in the first direction can be suppressed.

MODES FOR CARRYING OUT THE INVENTION

Figure 1:
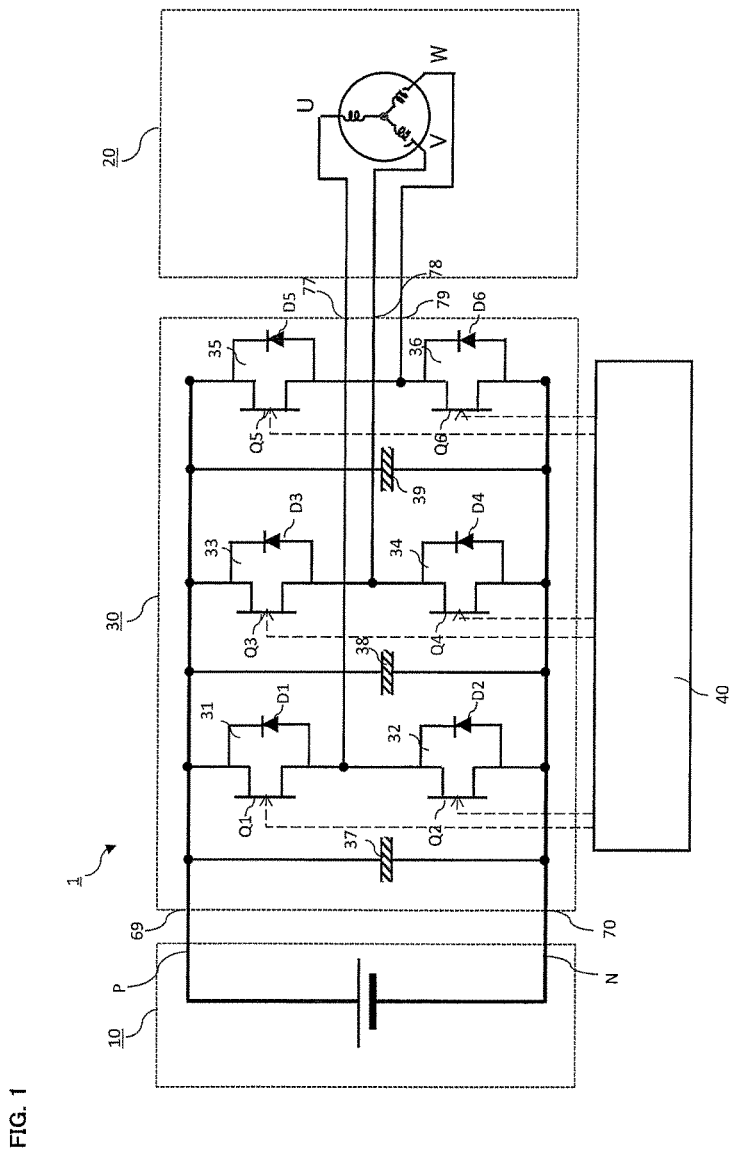
FIG. 1 is an electric circuit diagram showing a motor control system to which an embodiment of a power converter according to the present invention is applied.

FIG. 1 is an electrical circuit diagram showing an embodiment where an inverter 30, which is an embodiment of a power converter of the present embodiment as a direct current/three-phase alternating current converter, is applied to a motor control system 1. Although details are not shown in the figure, the motor control system 1 of the present embodiment can be also applied to an uninterruptible AC power supply device or the like in addition to a travel driving device of an electric vehicle. When the motor control system 1 of the present embodiment is applied to an electric vehicle, a hybrid vehicle, or a fuel battery vehicle, a three-phase alternating current load (AC load) 20 shown in FIG. 1 corresponds to a motor for travel driving and a direct current power source (DC power source) 10 composed of a secondary battery or the like corresponds to a battery for travel driving.

The motor control system 1 of the present embodiment includes the DC power source 10, the three-phase AC load 20, and the inverter 30 that converts direct current power of the DC power source 10 to three-phase alternating current power. The DC power source 10 can be constituted from, for example, a secondary battery such as a lithium ion battery or the like, a solar battery, a fuel battery, a power factor correction (PFC) converter, etc. When the AC load 20 has a regeneration function, the inverter 30 may be configured to convert alternating current power of the AC load 20 to direct current power and charge the DC power source 10.

The inverter 30 includes upper arm circuits 31, 33, and 35, lower arm circuits 32, 34, and 36, and smoothing capacitors 37, 38, and 39, and a controller 40. The inverter 30 converts direct current power of the DC power source 10 to three-phase alternating current power and supplies the converted power to the three-phase AC load 20. The main configuration of the upper arm circuits 31, 33, and 35 is a circuit where switching elements Q1, Q3, and Q5 as a power device are connected in parallel with diodes D1, D3, and D5 respectively. The main configuration of the lower arm circuits 32, 34, and 36 is similarly a circuit where switching elements Q2, Q4, and Q6 as a power device are connected in parallel with diodes D2, D4, and D6 respectively.

In the present embodiment, three pairs of circuits where two switching elements, Q1 and Q2, Q3 and Q4, and Q5 and Q6, are each connected in series, are connected between a power supply line P and power supply line N. In this way, the three pairs of circuits are connected in parallel with the DC power source 10. Also, each intermediate point in the connections to make pairs of switching elements Q1 and Q2, Q3 and Q4, and Q5 and Q6, is electrically connected to a respective three-phase input part of the three-phase AC load 20. In other words, as for the inverter 30 in the present embodiment, the upper arm circuit 31 and lower arm circuit 32, the upper arm circuit 33 and lower arm circuit 34, and the upper arm circuit 35 and lower arm circuit 36 are each serially connected as a pair, the intermediate point of connection between the upper arm circuit 31 and lower arm circuit 32 is connected to the U-phase of the AC load 20, the intermediate point of connection between the upper arm circuit 33 and lower arm circuit 34 is connected to the V-phase of the AC load 20, and the intermediate point of connection between the upper arm circuit 35 and lower arm circuit 36 is connected to the W-phase of the AC load 20.

These upper arm circuits and lower arm circuits, 31 to 36, are controlled by a controller 40 at high frequency for their switching. The controller 40 alternately controls ON and OFF of the upper arm circuit 31 and lower arm circuit 32 and controls output from the inverter 30 by increasing or decreasing the ON time ratio. The upper arm circuit 31 is configured from a switching element Q1, diode D1, and a gate driving circuit. The drain electrode of the switching element Q1 is connected to the cathode terminal of the diode D1, and the source electrode of the switching element Q1 is connected to the anode terminal of the diode D1. Further, the gate electrode of the switching element Q1 is connected to the controller 40 via a gate driving circuit. Each terminal in other upper arm circuits and lower arm circuits 32 to 36, is connected to the controller 40 in a similar configuration.

As for the switching elements Q1 to Q6 of the present embodiment, a wide-gap semiconductor device (SiC device, GaN device, or diamond device) or a Si device, for example, a junction field-effect transistor (JFET), a MOSFET, or an insulated gate bipolar transistor (IGBT) may be used. More, for each diode D1 to D6 of the present embodiment, for example, a fast recovery diode (FRD), Schottky barrier diode (SBD) or the like may be used.

The inverter 30 of the present embodiment includes three smoothing capacitors 37, 38, and 39. Each of the smoothing capacitors 37 to 39 is connected in parallel with a corresponding pair of an upper arm circuit and lower arm circuit, 31 and 32, 33 and 34, or 35 and 36, between the power supply line P and power supply line N. Although there are three smoothing capacitors 37 to 39 in total in the inverter 30 of the present embodiment, one for each of the three pairs of the upper arm circuit and lower arm circuit, 31 and 32, 33 and 34, and 35 and 36. However, one or two smoothing capacitors may be used by making the capacitor capacity larger, or four or more smoothing capacitors by making the capacitor capacity smaller. The number of smoothing capacitors should be appropriately selected according to the layout of the inverter 30 described later.

Figure 2A:
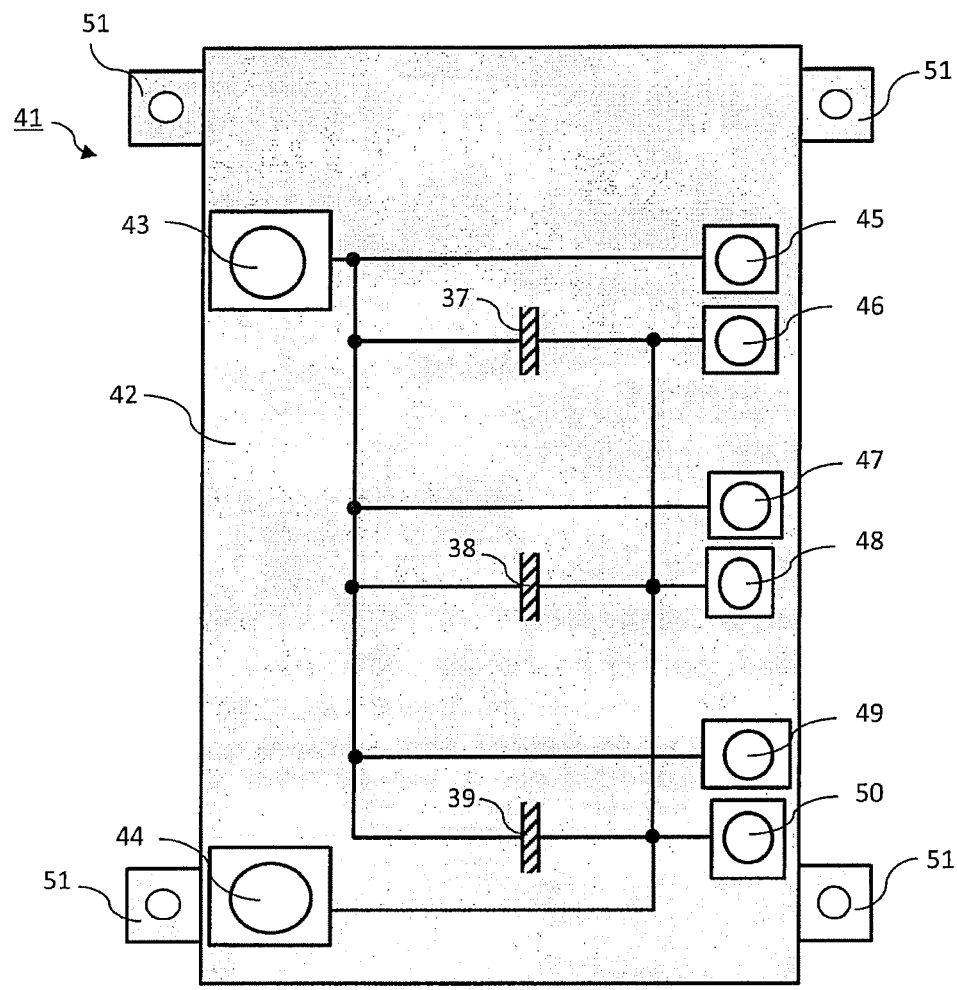
FIG. 2A is a plan view and front view showing a smoothing capacitor module included in an embodiment of a power converter according to the present invention.
Figure 2A:
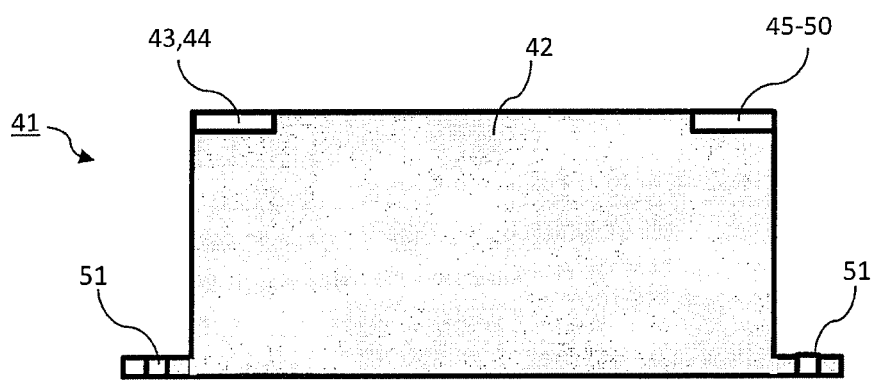
Figure 2B:
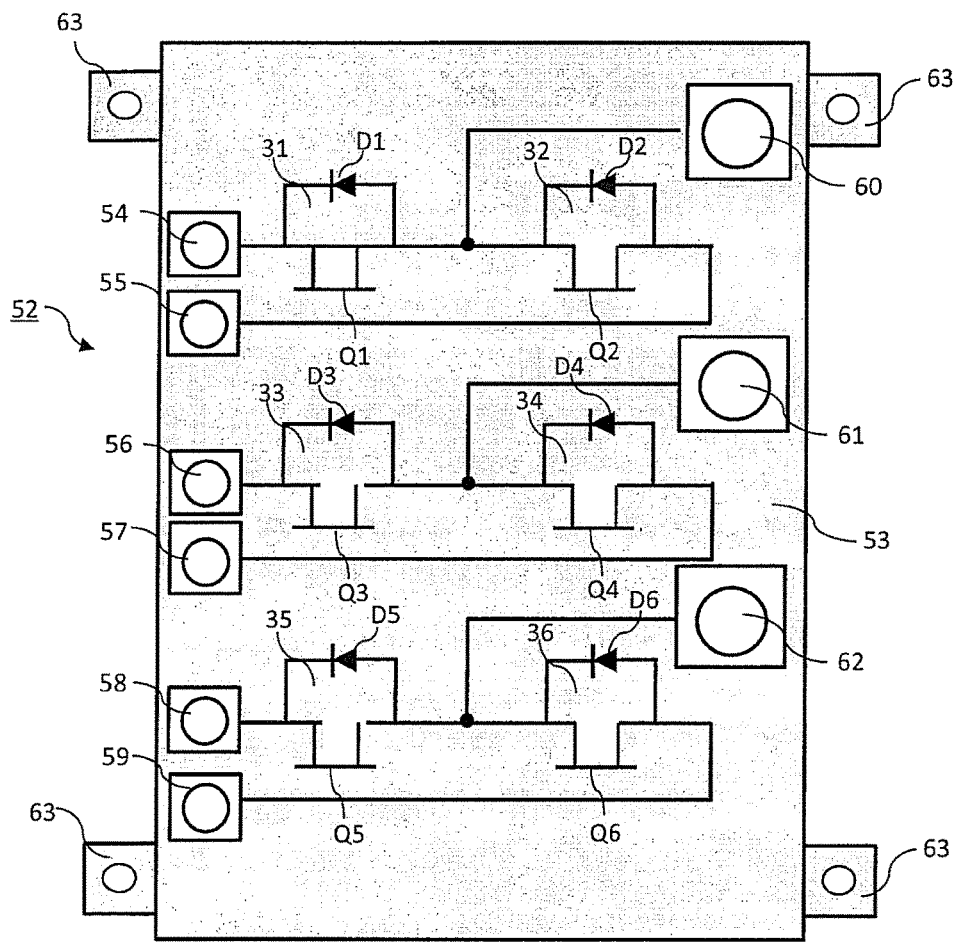
FIG. 2B is a plan view and front view showing a switching module included in an embodiment of a power converter according to the present invention.
Figure 2B:
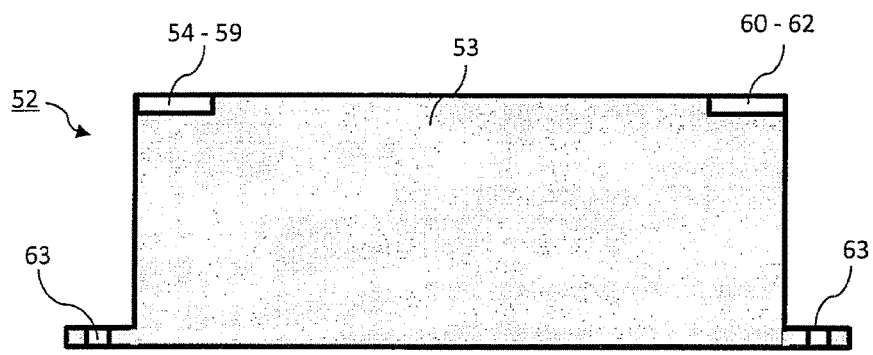
Figure 2B:
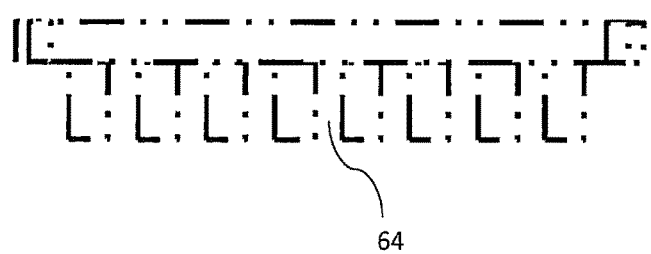

What is mentioned above is an electrical configuration of the inverter 30 of the present embodiment. Next, the outer shape, layout, and other mechanical structures of the components of the inverter 30 are explained. When a direction such as "upper/lower", "height", or "vertical" is indicated in the following explanation, it means the direction of the Z-axis shown in FIG. 3 and FIG. 4, but not intended to indicate the direction in a state where the inverter 30 of the present embodiment is mounted to a vehicle or uninterruptible power supply device. FIG. 2A is a plan view (upper figure) and front view (lower figure) showing the smoothing capacitor module 41 of the present embodiment. FIG. 2B is a plan view (upper figure) and front view (lower figure) showing the switching module 52 of the present embodiment. In both FIG. 2A and FIG. 2B, although components such as the main bodies of the smoothing capacitors 37 to 39, the main bodies of the switching elements Q1 to Q6, the main bodies of the diodes D1 to D6, and internal wirings cannot be confirmed externally by sight as they are placed inside the package 42 or 53, they are shown with a perspective view using circuit symbols in each plan view for convenience.

The smoothing capacitor module 41 of the present embodiment contains the main bodies of the three smoothing capacitors 37, 38, and 39 as shown in FIG. 2A and is configured from a packaging body of an approximately rectangular parallelepiped shape internally wired as shown in FIG. 2A. More, as shown in the figure, to the left-side edge part of the upper surface of the package 42, a positive terminal portion (P terminal portion) 43 to be connected to the plus terminal of the DC power source 10 and a negative terminal portion (N terminal portion) 44 to be connected to the minus terminal of the DC power source 10 are placed so as to be exposed to the outside of the package 42. Further, to the right-side edge part of the upper surface of the package 42, high-voltage connecting terminal portions of the capacitor side 45 to 50, for connecting the smoothing capacitors 37, 38, and 39 to the pairs of an upper arm circuit and lower arm circuit, 31 and 32, 33 and 34, and 35 and 36, are placed so as to be exposed to the outside of the package 42. Furthermore, attachments 51 are placed to the bottom part of the package 42 and by inserting and fastening the bolts to the through holes, the smoothing capacitor module 41 is fixed to a case 65 explained below.

The switching module 52 of the present embodiment contains six switching elements Q1 to Q6, and six diodes D1 to D6, as shown in FIG. 2B and is configured from a packaging body of an approximately rectangular parallelepiped shape internally wired as shown in FIG. 2B. More, as shown in the figure, to the left-side edge part of the upper surface of the package 53, high-voltage connecting terminal portions of the switching side 54 to 59, for connecting the pairs of upper arm circuit and lower arm circuit, 31 and 32, 33 and 34, and 35 and 36, to the smoothing capacitors 37, 38, and 39 are placed so as to be exposed to the outside of the package 53. Further, to the right-side edge part of the upper surface of the package 53, a U-terminal portion 60 to be connected to the U-phase of the AC load 20, a V-terminal portion 61 to be connected to the V-phase of the AC load 20, and a W-terminal portion 62 to be connected to the W-phase of the AC load 20 are placed so as to be exposed to the outside of the package 53. Furthermore, attachments 63 are placed to the bottom part of the package 53 and by inserting and fastening the bolts to the through holes, the switching module 52 is fixed to the case 65 explained below.

Next, the high-voltage connecting terminal portions of the capacitor side 45 to 50 located to the right-side edge part of the upper surface of the smoothing capacitor module 41 and the high-voltage connecting terminal portions of the switching side 54 to 59 located to the left-side edge part of the upper surface of the switching module 52 are connected in a configuration of the electrical circuit diagram shown in FIG. 1. However, in the present embodiment, the arrangement position of each high-voltage connection terminal part is considered so as to connect the high-voltage connecting terminal portions of the capacitor side 45 to 50 to the high-voltage connecting terminal portions of the switching side 54 to 59 formed almost at the opposing positions; that is, 45 to 54, 46 to 55, 47 to 56, 48 to 57, 49 to 58, and 50 to 59. A reference number 64 shown with a two-dot chain line in FIG. 2B is a water-cooled heat sink for emitting the heat generated at the switching module 52. The detailed configuration of the water-cooled heat sink is described later.

Figure 3:
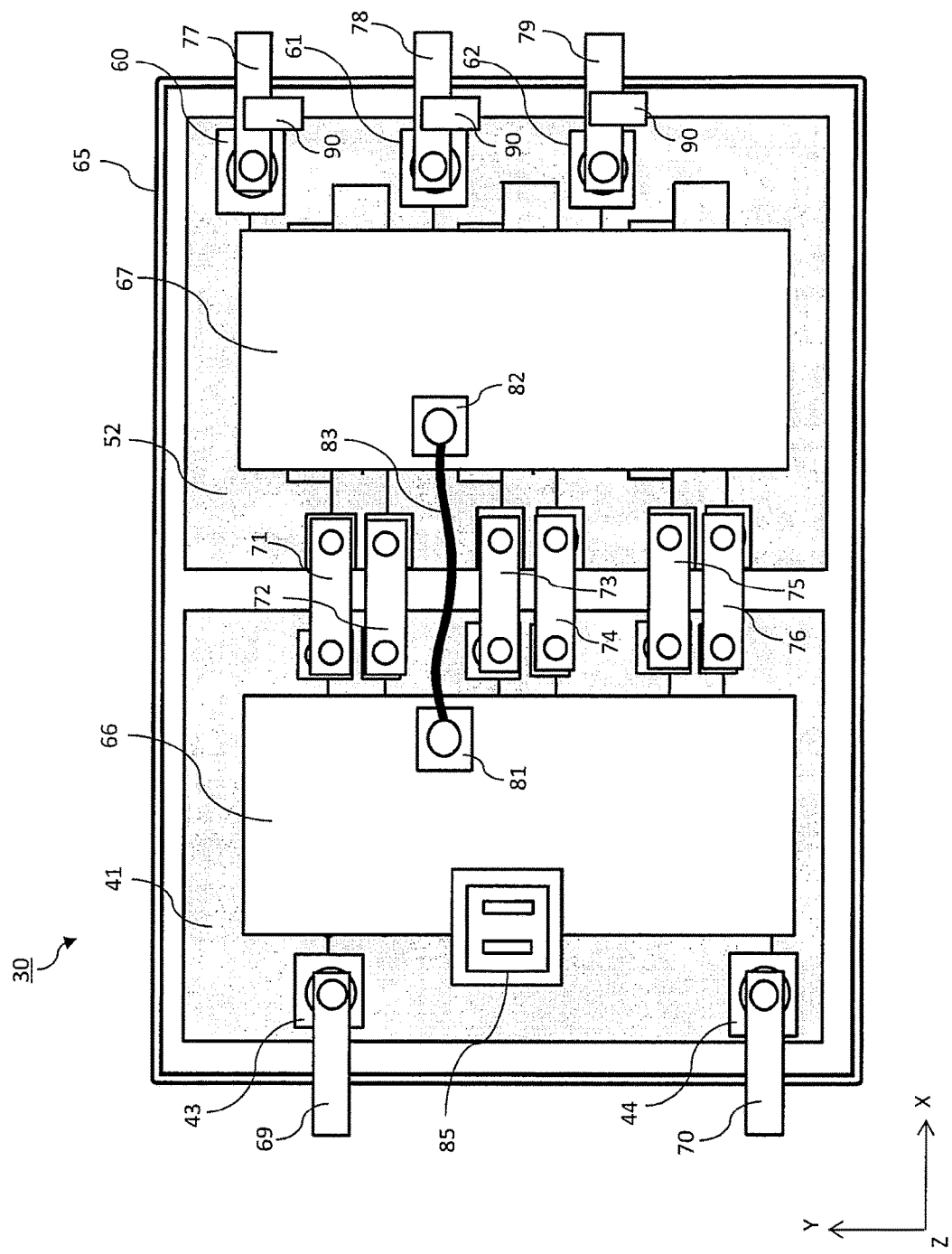
FIG. 3 is a plan view showing the inside of a case in an embodiment of a power converter according to the present invention.
Figure 4:
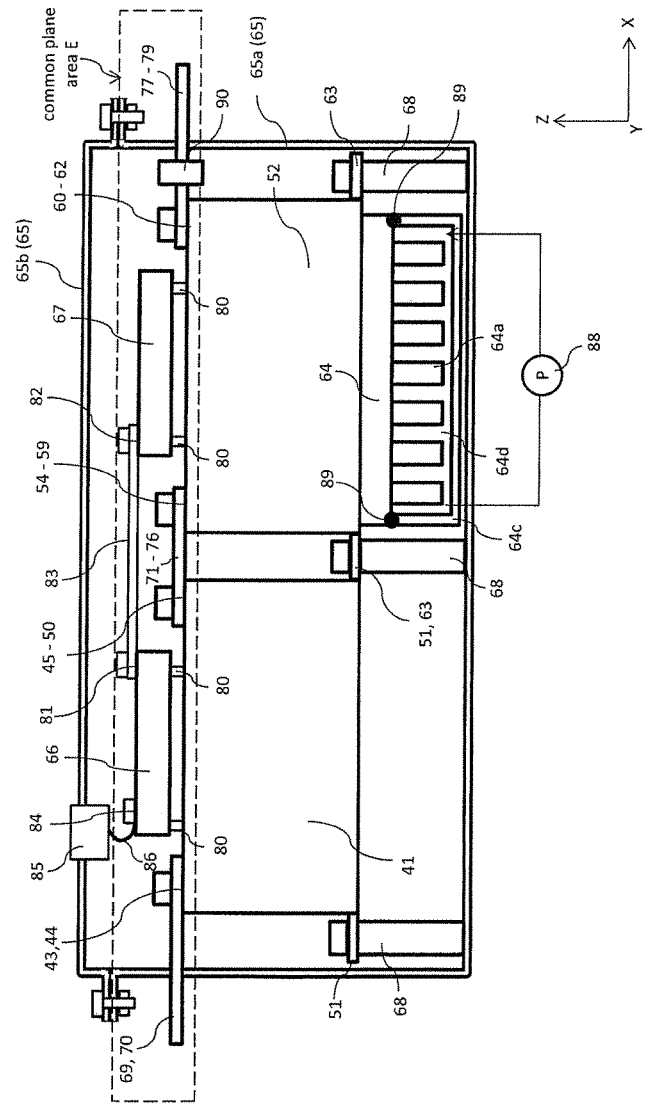
FIG. 4 is a front view showing the inside of a case in an embodiment of a power converter according to the present invention.

FIG. 3 is a plan view showing the inside of the case 65 of the inverter 30 in the present embodiment, and similarly, FIG. 4 is its front view. As for the inverter 30 of the present embodiment, the above-mentioned smoothing capacitor module 41 and switching module 52 are housed in the case 65, and also, the printed circuit board (PCB) constituting the controller 40 and the circuit boards 66 and 67 such as printed wiring board (PWB) are housed in the case 65. As shown in FIG. 3 and FIG. 4, the case 65 of the present embodiment has almost a rectangular parallelepiped shape and includes a case body 65a constituting the lower part of the case 65 and a case cover 65b constituting the upper part of the case 65. By putting the flange parts of the case body 65a and the flange parts of the case cover 65b together and fastening with bolts or nuts, etc., the inside of the case 65 is closed. The case 65 is composed of an insulating material.

To the bottom part of the case body 65a, the smoothing capacitor module 41 and switching module 52 mentioned above are fixed as shown in FIG. 4. Structure for fixing these modules to the case body 65a is not particularly limited, but in the present embodiment, to each boss portion 68 constituting an attachment placed at suitable positions on the bottom surface of the case body 65a, both the attachment 51 of the smoothing capacitor module 41 and attachment 63 of the switching module 52 are put together and fixed by fastening a bolt. By doing this, a space for the amount of the height of the boss portion 68 is created between the bottom surface of the package 42 of the smoothing capacitor module 41 and the bottom surface of the case body 65a, and also between the bottom surface of the package 53 of the switching module 52 and the bottom surface of the case body 65a. Further, the smoothing capacitor module 41 and the switching module 52 may be fixed to a rigid substrate and then the substrate can be fixed to the case body 65a.

As shown in FIG. 3 and FIG. 4, to each of the P terminal portion 43 and N terminal portion 44 of the smoothing capacitor module 41, the bus bars 69 and 70 for connecting with connectors (not shown in the figures) of the DC power source 10 shown in FIG. 1 are fixed respectively with a bolt or the like. Further, between the high-voltage connecting terminal portions of the capacitor side 45 to 50 and the high-voltage connecting terminal portions of the switching side 54 to 59 of the switching module 52, six bus bars 71 to 76 are each fixed with bolts or the like for electrically connecting them inside the case 65. Furthermore, to each of the U-terminal portion 60, V-terminal portion 61, and W-terminal portion 62 of the switching module 52, bus bars 77 to 79 are fixed respectively with a bolt or the like for connection to the connectors (not shown in the figures) of the AC load 20. The bus bars 69 and 70 for connecting with the DC power source 10 and the bus bars 77, 78, and 79 for connecting with the AC load 20 are placed so as to be expose to the outside while extending from the inside of the case 65.

The circuit boards 66 and 67 to which various types of drive circuit parts for driving switching elements Q1 to Q6 are mounted are also housed inside the case 65. These circuit boards 66 and 67 constitute the controller 40 shown in FIG. 1. The circuit boards 66 and 67 of the present embodiment have been divided into two pieces to a size mountable to the upper surfaces of the smoothing capacitor module 41 and switching module 52 as shown in FIG. 3 and FIG. 4, and fixed with bolts or the like to each upper surface of the smoothing capacitor module 41 and switching module 52 via boss portions 80. Also, to each upper surface of the circuit boards 66 and 67, circuit terminals 81 and 82 are placed respectively for connecting between wiring circuits of the circuit board 66 and wiring circuits of the circuit board 67, and these circuit terminals 81 and 82 are electrically connected by a wire harness 83.

Further, as shown in FIG. 3, to each of the bus bars 77 to 79 connected to the U-terminal portion 60, V-terminal portion 61, and W-terminal portion 62 respectively, a current sensor 90 for detecting a value of the current that flows through the bus bar is mounted. Also, with wire harnesses omitted from illustration, the current sensors 90 are connected to the circuit boards 66 and 67. More, to the upper surface of the circuit board 66, an input/output terminal 84 is placed for sending and receiving command signals and detected signals between the controller 40 and is electrically connected to a connector 85 provided on the upper surface of the case cover 65b of the case 65 with a wire harness 86. By connecting a vehicle controller or a controller of an uninterruptible power supply device not shown in the figure to this connector 85, the inverter 30 of the present embodiment is controlled. Furthermore, although the connector 85 is provided on the upper surface of the case cover 65b in the present embodiment, the connector 85 may be provided to the side of the case cover 65b or to the side of the case body 65a.

Figure 5:
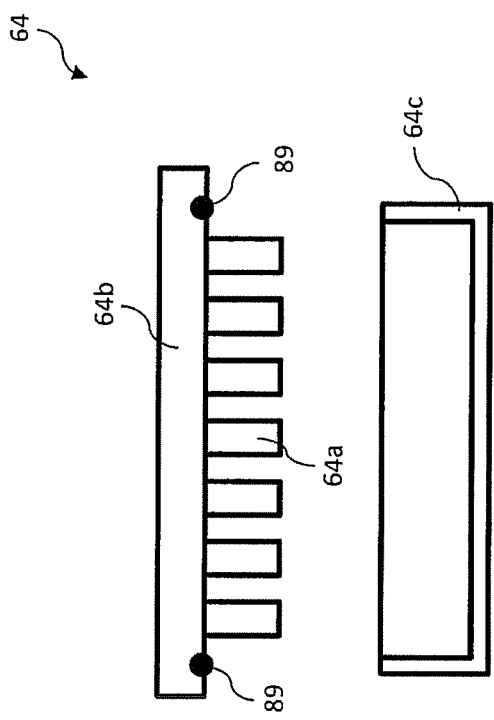
FIG. 5 is a sectional view showing the heat sink in FIG. 4.

As shown in FIG. 4, as for the inverter 30 of the present embodiment, a heat sink 64 of a water-cooled type is arranged to the lower surface of the switching module 52. This heat sink 64 is fixed to the lower surface of the switching module 52 with bolts or the like not shown in the figure. FIG. 5 is an exploded sectional view showing the water-cooled type heat sink 64 of the present embodiment. The heat sink 64 of the present embodiment includes a jacket cover 64b where a heat dissipation portion 64a is formed to the lower surface of a flat-plate member and a cooling jacket 64c having an open upper surface and a bottom surface. The heat dissipation portion 64a formed to the jacket cover 64b includes, although detailed illustration is omitted from the sectional view in FIG. 5, fins formed in a meandering manner along the lower surface of the jacket cover 64b. From the state shown in FIG. 5, by covering and fixing the jacket cover 64b to the cooling jacket 64c, a coolant passage 64d is formed by the sides and bottom surface of the cooling jacket 64c in combination. To one end of the cooling passage 64d of the cooling jacket 64c, there is an opening portion for absorbing the coolant flowing through the coolant passage, and to the other end, there is an opening portion for returning the absorbed coolant into the coolant passage.

Additionally, as shown in FIG. 4, the coolant is absorbed from the opening portion at one end of the coolant passage by a circulation pump 88 and circulated through the other opening portion. Consequently, because the heat sink 64 of the present embodiment is a water-cooled type, the switching module 52 can be sufficiently cooled even when air-cooling capacity is low due to a stop of the vehicle or the like. However, as shown in FIG. 4, when the water-cooled heat sink 64 is housed inside the case 65 of the inverter 30, the coolant may exert a negative influence on components of the inverter 30 when the coolant that flows through the coolant passage 64d leaks inside the case 65. For this reason, for the water-cooled heat sink 64 of the present embodiment, a sealing portion 89 including a gasket such as an FIPG (formed-in-place gasket) or the like and a rubber gasket, etc., is arranged to the joint surface between the jacket cover 64b and cooling jacket 64c. More, in the inverter 30 of the present embodiment, the sealing portion 89 for stopping the coolant from leaking to the inside of the case 65 is arranged so as to be in the lower part of the case 65.

As above, in the inverter 30 of the present embodiment, the bus bar 69 to be connected to the P terminal portion 43 of the smoothing capacitor module 41 and DC power source 10, and the bus bar 70 to be connected to the N terminal portion 44 of the smoothing capacitor module 41 and DC power source 10 are arranged to the upper part of the case 65. Also, the bus bar 77 to be connected to the U-terminal portion 60 of the switching module 52 and the U-phase of the AC load 20, the bus bar 78 to be connected to the V-terminal portion 61 of the switching module 52 and the V-phase of the AC load 20, and the bus bar 79 to be connected to the W-terminal portion 62 of the switching module 52 and the W-phase of the AC load 20 are arranged to the upper part of the case 65.

Further, in the inverter 30 of the present embodiment, the bus bars 71 to 76 for connecting the high-voltage connecting terminal portions of the capacitor side 45 to 50 of the smoothing capacitor module 41, and the high-voltage connecting terminal portions of the switching side 54 to 59 of the switching module 52, are also arranged to the upper part of the case 65. Furthermore, the circuit boards 66 and 67 that have been divided into two pieces are also arranged to the upper part of the case 65.

Figure 6:
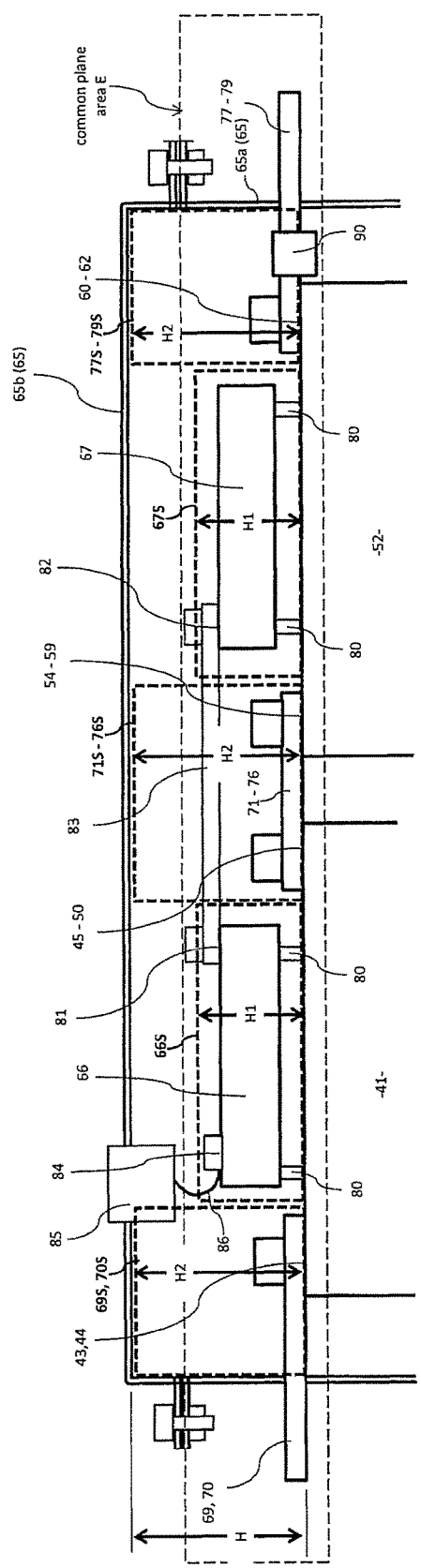
FIG. 6 is an enlarged front view showing an upper-side part of the case in FIG. 4.

Here, as for the inverter 30 of the present embodiment, the bus bars 69 to 79 where high-voltage power is input and output therethrough and the circuit boards 66 and 67 where low-voltage power is input and output therethrough are arranged to the common plane area E indicated with a dotted line in FIG. 4. The common plane area E of the present embodiment indicates an area including the XY-plane having a certain dimension in the Z-axis direction which is the direction of height of the case 65. An enlarged front view of the upper part of the case 65 in FIG. 4 is shown in FIG. 6.

Figure 8:
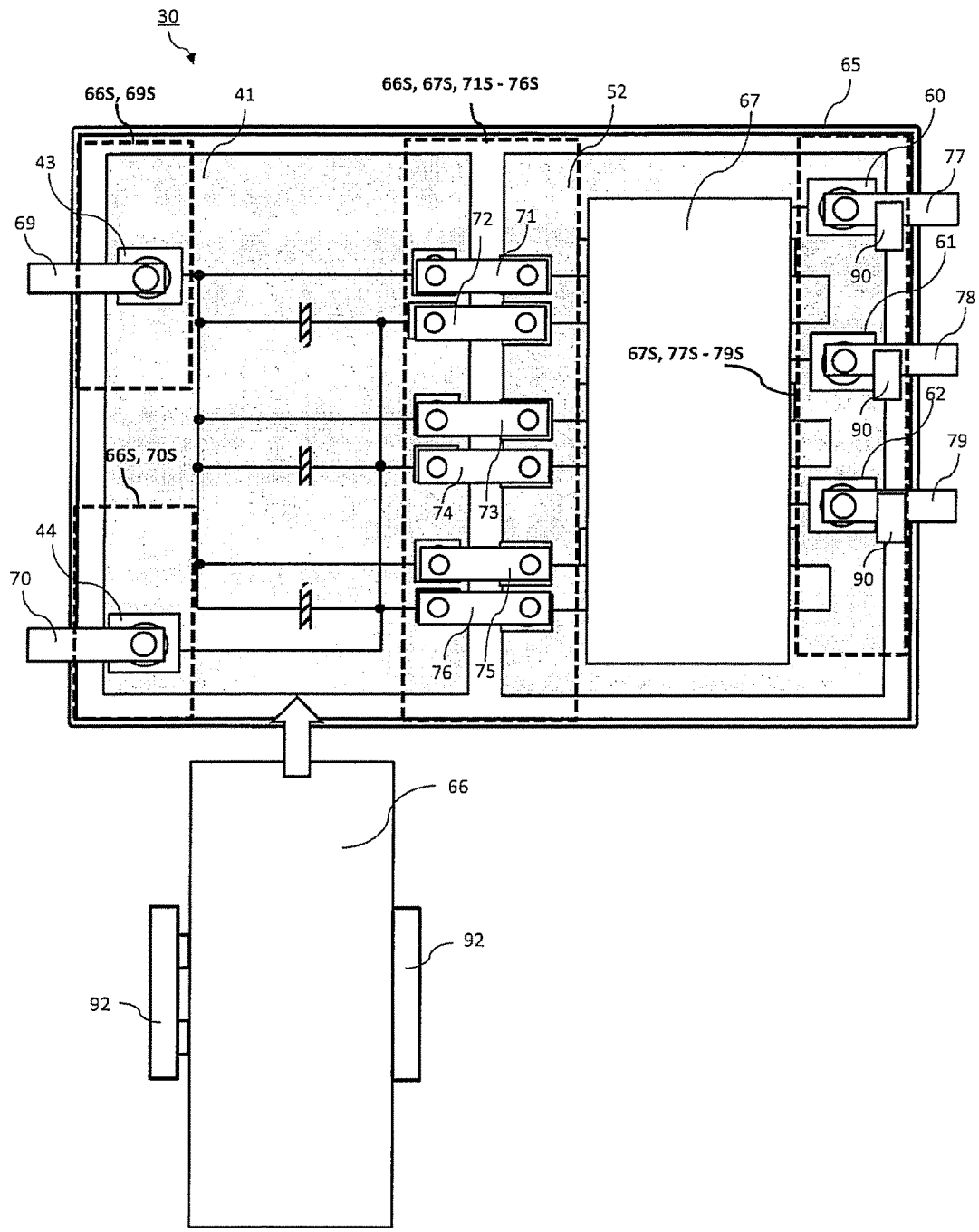
FIG. 8 is a plan view showing the inside of a case when assembling an embodiment of a power converter according to the present invention.

In order to arrange components to which current flows to the inside of the case 65 made of an insulating material, an insulating space needs to be provided to secure insulation when the components are not covered with an insulating member. As for the components of the inverter 30 in the present embodiment, the bus bars 69 to 79 and the mounting surfaces of circuit boards 66 and 67 are not covered by an insulating member. For this reason, as shown in FIG. 6, to the direction of height (Z-axis direction) of the case 65, insulating spaces 66S and 67S of the height H1 are prepared around the circuit boards 66 and 67, and insulating spaces 69S to 79S of the height H2 are prepared around the bus bars 69 to 79. The height of the insulating spaces for the bus bars 69 to 79 is set higher (H1<H2) as higher voltage power is supplied compared to the circuit boards 66 and 67. Further, the insulating spaces 66S and 67S for the circuit boards 66 and 67 and the insulating spaces 69S to 79S for the bus bars 69 to 79 in the XY-plane direction of the case 65 are shown in FIG. 8.

These insulating spaces are so-called a dead space where only components covered with an insulating member can be arranged therein. For this reason, when the bus bars 69 to 79 and circuit boards 66 and 67 are placed so as to stack in the direction of height, the dimension in the direction of height becomes extremely large. However, in the inverter 30 of the present embodiment, the smoothing capacitor module 41 and switching module 52 are arranged side by side in the XY-plane direction of the case 65, and also, to the upper surfaces of the smoothing capacitor module 41 and switching module 52, the bus bars 69 to 79 and the circuit boards 66 and 67 are arranged so as to be included in the common plane area E. Consequently, as in an example shown in FIG. 6 where the upper surfaces of the smoothing capacitor module 41 and switching module 52 are almost of the same height, the height dimension H, which is the height from these upper surfaces to the case cover 65b of the case 65, becomes equal to the height H2 which is the height of the insulating spaces 69S to 79S of the bus bars 69 to 79. In other words, as in the example shown in FIG. 6, the insulating spaces 66S and 67S of the circuit boards 66 and 67 are placed so as to be included in the insulating spaces 69S to 79S of the bus bars 69 to 79 in the direction of height.

Figure 7:
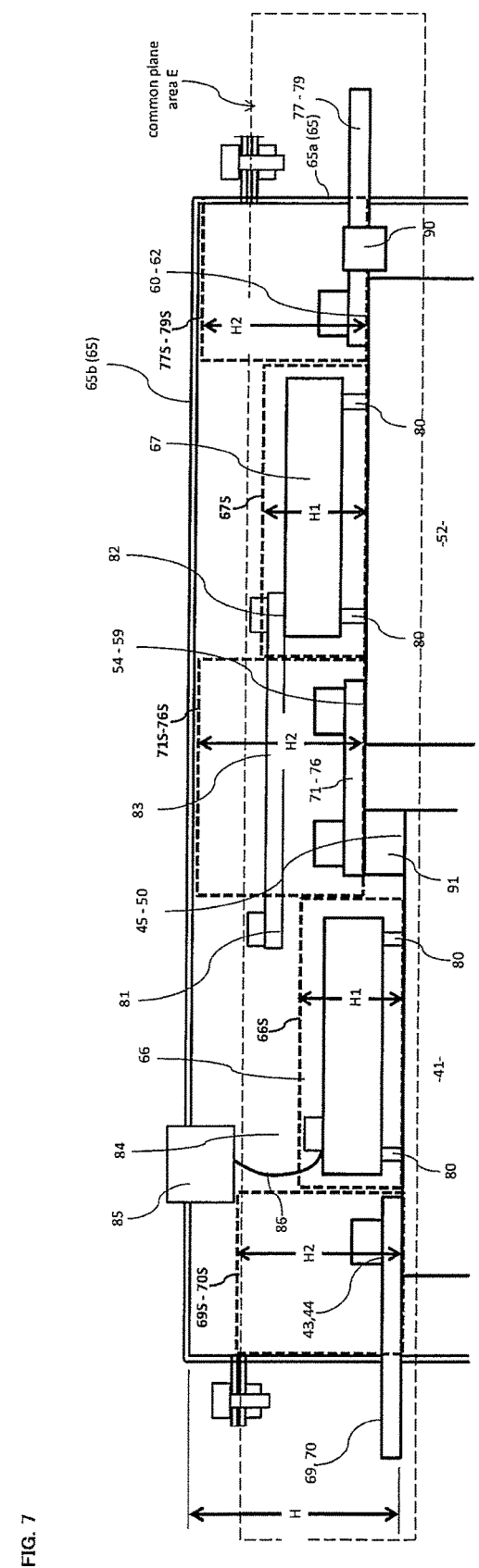
FIG. 7 is an enlarged front view showing an upper-side part of a case in another embodiment of a power converter according to the present invention.

In order to make the upper surfaces of the smoothing capacitor module 41 and switching module 52 flat in the direction of height, the height dimension of the boss portion 68 needs to be set appropriately. However, as shown in FIG. 7, when the upper surfaces of the smoothing capacitor module 41 and switching module 52 cannot be made flat for any reason, similar conductive boss portions 91 should be placed to the high-voltage connecting terminal portions of the capacitor side 45 to 50 or to the high-voltage connecting terminal portions of the switching side 54 to 59, or though not shown in the figure, the bus bars 71 to 76 should be bent. In such a circumstance, as shown in FIG. 7, it is preferable that the insulating spaces 66S and 67S of the circuit boards 66 and 67 and the insulating spaces 69S to 79S of the bus bars 69 to 79 be placed overlapping each other in the direction of height of the case 65. In such a way, the height dimension H, which is the height from each upper surface of the smoothing capacitor module 41 and switching module 52 to the case cover 65b of the case 65 becomes smaller than the sum of the height H1 of the insulating spaces 66S and 67S of the circuit boards 66 and 67 and the height H2 of the insulating spaces 69S to 79S of the bus bars 69 to 79 (H<H1+H2).

On the other hand, as for the inverter 30 of the present embodiment, as shown in FIG. 6 and FIG. 7, when the case cover 65b of the case 65 is arranged to the vertically upper side of the inverter 30, desirably, the highest position among the insulating spaces 66S and 67S of the circuit boards 66 and 67 and the insulating spaces 69S to 79S of the bus bars 69 to 79 is set as the inner surface of the case cover 65b of the case 65. Further, as for the inverter 30 of the present embodiment, the case cover 65b can be arranged upside down from those cases shown in FIG. 6 and FIG. 7, that is to the vertically lower side of the inverter 30. However, in such a case, it is desirable that the lowest position among the insulating spaces 66S and 67S of the circuit boards 66 and 67 and the insulating spaces 69S to 79S of the bus bars 69 to 79 be set as the inner surface of the case cover 65b of the case 65.

Moreover, in the inverter 30 of the present embodiment, a wire harness 83 covered with an insulating material is wired almost within the range of the insulating spaces 66S and 67S of the circuit boards 66 and 67 and the insulating spaces 71S to 76S of the bus bars 71 to 76. Furthermore, in the inverter 30 of the present embodiment, the current sensors 90 mounted to the bus bars 77 to 79 are also arranged within the insulating spaces 77S to 79S of these bus bars 77 to 79.

On the other hand, the inverter 30 of the present embodiment also exhibits particular effects in an assembling process. FIG. 8 is a plan view illustrating the inside of the case 65 when assembling the inverter 30 of the present embodiment. In the figure, a state where the circuit board 66 is mounted to the upper surface of the smoothing capacitor module 41 is shown as an example. The reference numeral 92 indicates a cross section of a hand of an assembling robot. When the circuit board 66 is held by the hands 92 of the assembling robot and moved to the upper surface of the smoothing capacitor module 41 assembled to the case 65 in advance, the hand 92 of the assembling robot require an operating space, that is a space not interfered by the hand 92, to both the right and left of the assembling position of the circuit board 66. When other components are mounted within the space, the circuit board 66 cannot be assembled. However, in the inverter 30 of the present embodiment, the insulating spaces 69S to 76S of the bus bars 69 to 76 are set to the right and left of the assembling position of the circuit board 66 that there are no other components. For this reason, the circuit board 66 can be moved to the assembling position without having the hand 92 of the assembling robot interfered with other components.

For the above reasons, the inverter 30 of the present embodiment exhibits the following effects.

In the inverter 30 of the present embodiment, the bus bars 69 to 79 and circuit boards 66 and 67 are arranged in the common plane area E that the insulating spaces 69S to 79S of the bus bars and the insulating spaces 66S and 67S of the circuit boards are overlapped in the direction of height. As a result, increase in the size of the case 65 in the direction of height can be suppressed. Also, as a result of disposing the bus bars 69 to 79 and circuit boards 66 and 67 in the common plane area E, the length of the bus bars 69 to 79 to which high-voltage power is supplied can be shortened and impedance of the bus bars can be decreased.

Further, in the inverter 30 of the present embodiment, as shown in FIG. 7, the insulating spaces 66S and 67S of the circuit boards 66 and 67 and the insulating spaces 69S to 79S of the bus bars 69 to 79 are arranged so as to be overlapped each other. Consequently, the height dimension H, which is the height from each upper surface of the smoothing capacitor module 41 and switching module 52 to the case cover 65b of the case 65 becomes smaller than the sum of the height H1 of the insulating spaces 66S and 67S of the circuit boards 66 and 67 and the height H2 of the insulating spaces 69S to 79S of the bus bars 69 to 79 (H<H1+H2). As a result, increase in the size of the case 65 in the direction of height can be suppressed.

More, in the inverter 30 of the present embodiment, as shown in FIG. 6, the insulating space 66S and 67S of the circuit boards 66 and 67 are arranged so as to be included to the insulating spaces 69S to 79S of the bus bars 69 to 79 in the direction of height. Consequently, the height dimension H, which is the height from each upper surface of the smoothing capacitor module 41 and switching module 52 to the case cover 65b of the case 65 becomes equal to the height H2, which is the height of the insulating spaces 69S to 79S of the bus bars 69 to 79. As a result, increase in the size of the case 65 in the direction of height can be suppressed.

Additionally, in the inverter 30 of the present embodiment, when the case cover 65b of the case 65 is arranged to the vertically upper side of the inverter 30 as shown in FIG. 6 and FIG. 7, the highest position among the insulating spaces 66S and 67S of the circuit boards 66 and 67 and the insulating spaces 69S to 79S of the bus bars 69 to 79 is set as the inner surface of the case cover 65b of the case 65. Whereas, when arranging upside down, the lowest position among the insulating spaces 66S and 67S of the circuit boards 66 and 67 and the insulating spaces 69S to 79S of the bus bars 69 to 79 is set as the inner surface of the case cover 65b of the case 65. Consequently, increase in the size of the case 65 in the height direction can be suppressed.

Also, in the inverter 30 of the present embodiment, almost within the range of the insulating spaces 69S to 79S of the bus bars 69 to 79 and insulating spaces 66S and 67S of the circuit boards 66 and 67, the wire harness 83 covered with an insulating material is wired and the current sensors 90 are arranged. These also lead to suppress increase in the size of the case 65.

Further, in the inverter 30 of the present embodiment, the smoothing capacitor module 41 and switching module 52 are placed side by side in the XY-plane direction of the case 65. Also, to the upper surfaces of these smoothing capacitor 41 and switching module 52, the bus bars 69 to 79 and circuit boards 66 and 67 are arranged so as to be included in the common plane area E. Accordingly, also from the viewpoint of assembly workability, the rate of automation can be improved as interference of the hands 92 of the assembling robot with other components is reduced.

The bus bars 69 and 70 correspond to the first high-voltage terminal according to the present invention, the bus bars 77, 78, and 79 correspond to the second high-voltage terminal according to the present invention, the bus bars 71 to 76 correspond to the third high-voltage terminal according to the present invention, the bus bars 69 to 79 correspond to the high-voltage terminal according to the present invention, the direction of height and the Z-axis direction correspond to the first direction according to the present invention, and the XY-plane corresponds to the plane in the second direction according to the present invention.

DESCRIPTION OF REFERENCE NUMERALS

1 . . . motor control system
10 . . . direct current power source (DC power source)
20 . . . alternating current load (AC load)
30 . . . inverter (power converter)
31, 33, 35 . . . upper arm circuit
32, 34, 36 . . . lower arm circuit
Q1-Q6 . . . switching element
D1-D6 . . . diode
37, 38, 39 . . . smoothing capacitor
40 . . . controller
41 . . . smoothing capacitor module
42 . . . package
43 . . . positive terminal portion (P terminal portion)
44 . . . negative terminal portion (N terminal portion)
45-50 . . . high-voltage connecting terminal portion of the capacitor side
51 . . . attachment
52 . . . switching module
53 . . . package
54-59 . . . high-voltage connecting terminal portion of the switching side
60 . . . U-terminal portion
61 . . . V-terminal portion
62 . . . W-terminal portion
63 . . . attachment
64 . . . heat sink
64a . . . heat dissipation portion
64b . . . jacket cover
64c . . . cooling jacket
64d . . . coolant passage
65 . . . case
65a . . . case body
65b . . . case cover
66, 67 . . . circuit board 68 . . . boss portion
69-79 . . . bus bar
80 . . . boss portion
81, 82 . . . circuit terminal
83 . . . wire harness
84 . . . input and output terminal
85 . . . connector
86 . . . wire harness
87 . . . opening portion
88 . . . circulation pump
89 . . . sealing portion
90 . . . current sensor
91 . . . conductive boss portion
92 . . . hand of an assembling robot
E . . . common plane area

The invention claimed is:

1. A power converter comprising components of a power converter circuit, the components including a switching element, a smoothing capacitor, circuit boards on which drive circuit parts for driving the switching element are mounted,
wherein the components are housed in a case, and input power is converted and output through high-voltage terminals,
the switching element and the smoothing capacitor are housed in the case side by side,
the high-voltage terminals include a first high-voltage terminal through which power to be converted is input, a second high-voltage terminal through which converted power is output, and a third high-voltage terminal with which the smoothing capacitor and the switching element are connected,
a P-side power source terminal and a N-side power source terminal of a pair of switching elements connected in series are provided side by side,
a P-side power source terminal and a N-side power source terminal of the smoothing capacitor connected in parallel with the pair of switching elements are provided side by side,
the P-side power source terminal of the pair of switching elements and the P-side power source terminal of the smoothing capacitor are provided at opposing positions, the N-side power source terminal of the pair of switching elements and the N-side power source terminal of the smoothing capacitor are provided at opposing positions,
the P-side power source terminal of the pair of switching elements and the P-side power source terminal of the smoothing capacitor provided at the opposing positions are connected by the third high-voltage terminal arranged in a horizontal direction, the N-side power source terminal of the pair of switching elements and the N-side power source terminal of the smoothing capacitor provided at the opposing positions are connected by the third high-voltage terminal arranged in a horizontal direction,
a first one of the circuit boards is provided above the switching element and a second one of the circuit boards is provided above the smoothing capacitor side by side with the first circuit board, and
the high-voltage terminals and the circuit boards are provided in a common plane area.

2. The power converter according to claim 1, wherein
the high-voltage terminals and the circuit boards are provided in the case each with an insulating space to secure electrical insulation between the high-voltage terminals, between the circuit boards or between the high-voltage terminals and the circuit boards, and
the high-voltage terminals and the circuit boards are provided in the common plane area so that a length range of the insulating space of the high-voltage terminals in a first direction and a length range of the insulating space of the circuit boards in the first direction are overlapped with each other.

3. The power converter according to claim 2, wherein
the high-voltage terminals and the circuit boards are provided in the common plane area so that the length range of the insulating space of one of the high-voltage terminals or the circuit boards in the first direction includes the length range of the insulating space of another of the high-voltage terminals or the circuit boards in the first direction.

4. The power converter according to claim 2, wherein
a highest position in the length range of the insulating spaces of the high-voltage terminals or the circuit boards in the first direction is at the same position level as an upper surface of the case, or
a lowest position of the length range of the insulating spaces of the high-voltage terminals or the circuit boards in the first direction is at the same position level as a lower surface of the case.

5. The power converter according to claim 2, wherein
the high-voltage terminals and the circuit boards are provided in the common plane area so that a length range of the insulating space of the high-voltage terminals or the circuit boards in a second direction intersecting perpendicularly with the first direction and a length range of a working space in the second direction for assembling and housing the components of the power converter circuit in the case are overlapped with each other.

6. The power converter according to claim 1, wherein
another component of the power converter circuit is provided in an insulating space of the high-voltage terminals or the circuit boards.

* * * * *